(12) United States Patent
Takeshita et al.

(10) Patent No.: US 6,376,917 B1
(45) Date of Patent: Apr. 23, 2002

(54) SEMICONDUCTOR DEVICE

(75) Inventors: Kaneyoshi Takeshita; Toshiharu Yanagida, both of Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/611,205

(22) Filed: Jul. 6, 2000

(30) Foreign Application Priority Data

Jul. 6, 1999 (JP) .......................................... 11-191252

(51) Int. Cl.[7] .............................................. H01L 23/48
(52) U.S. Cl. ...................................... 257/778; 438/108
(58) Field of Search .......................... 29/830; 361/705; 257/679, 777, 706, 713, 737, 782; 438/108

(56) References Cited

U.S. PATENT DOCUMENTS

| 5,065,505 A | * | 11/1991 | Matsubara et al. | 29/830 |
|---|---|---|---|---|
| 5,396,403 A | * | 3/1995 | Patel | 361/705 |
| 5,477,082 A | * | 12/1995 | Bcukley, III et al. | 257/679 |
| 5,977,640 A | * | 11/1999 | Bertin et al. | 257/777 |
| 6,075,287 A | * | 6/2000 | Ingraham et al. | 257/706 |
| 6,133,637 A | * | 10/2000 | Hikita et al. | 257/777 |
| 6,150,724 A | * | 11/2000 | Wenzel et al. | 257/777 |

* cited by examiner

*Primary Examiner*—David Nelms
*Assistant Examiner*—Bau T Le
(74) *Attorney, Agent, or Firm*—Sonnenschein, Nath & Rosenthal

(57) ABSTRACT

A semiconductor device is characterized by mixedly mount a logic chip, an analog chip, a memory chip, etc. by stacking them while stabilizing power supply lines and ground lines of each chip. The semiconductor device has an intermediate substrate having a conductive portion and also having, on its one surface, an external connection terminal conducted to the conductive portion; and semiconductor chips each of which has connection portions, and which are mounted on both the surfaces of the intermediate substrate. At least two of the above semiconductor chips are electrically conducted to each other via the conductive portion of the intermediate substrate. At least one of a power supply line, a ground line, and a signal line of each of the semiconductor chips is connected to the conductive portion of the intermediate substrate via two or more, conducted to each other, of the connection portions.

8 Claims, 3 Drawing Sheets

SEMICONDUCTOR DEVICE

BACKGROUND OF THE INVENTION

The present invention relates to a semiconductor device including a plurality of semiconductor chips mounted on a substrate, and particularly to a semiconductor device suitable for realizing the reduction in size and weight of electronic equipment and the improvement of performances of the electronic equipment.

Recently, to reduce sizes of semiconductor chips and increase the level of integration of the semiconductor chips, a technology of mixedly mounting a at logic circuit, an analog circuit, and memories such as a DRAM and a flash memory on the same silicon substrate has been proposed and partially put into practical use.

The technology of mixedly mounting semiconductor chips on the same silicon substrate, however, has various technical problems caused by evolution of a process of fabricating each of the semiconductor chips.

For example, a thermal process necessary for forming a DRAM capacitor causes a problem in impairing an ultra-shallow junction profile essential for realizing a finer structure of a transistor in a logic chip, and also causes a problem in allowing boron in a gate electrode of a P-channel transistor to pass through a gate insulating film, to make a channel profile of the P-channel transistor different from a design profile, thereby degrading the current characteristics of the transistor.

An analog circuit, which interfaces with external chips such as a driver, an amplifier and sensor, requires a higher withstand voltage and a higher input range than those of an advanced CMOS, and accordingly, the analog circuit is hard to be made finer in its geometrical structure. For a semiconductor chip in which the above analog circuit is integrated with a logic LSI required to be made very finer in its geometrical structure, most of the semiconductor chip is occupied by the analog circuit hard to be reduced in its area, to reduce an economical merit obtained by mixed mounting of the analog circuit and the logic circuit.

In addition to the above technology of mixedly mounting semiconductor chips on the same silicon substrate, a technology of mixedly mounting semiconductor chips on a package level has been also positively promoted.

A so-called chip-on-chip structure including semiconductor chips simply stacked to each other is advantageous in shortening lengths of interconnections; however, it is disadvantageous in sacrificing reinforcement of power source lines and ground lines in the chips. In an ultra-high speed CPU or DSP, an excessive current flowing in a chip reduces an effective inner voltage due to resistances of a power supply line and a ground line, to thereby reduce the operational speed.

Even for a low power chip desired to realize operation at a significantly low supply voltage, the performance thereof may be significantly degraded by a slight reduction in potential due to resistances of interconnections. In particular, a chip desired to be operated at a voltage being as significantly low as 1 V or less, for example, a chip having a structure using an SOI (Si on insulator) substrate requires a very stable power supply line and a very stable ground line.

Against such a background, power supply lines and ground lines of chips have been conventionally formed from multi-level interconnections, and in recent years, a technology of forming bonding pads corresponding to a plurality of power supply lines and ground lines in chips and connecting them to interconnections formed in a substrate, thereby further stabilizing the power supply lines and ground lines of the chips has been put in practical use.

SUMMARY OF THE INVENTION

An object of the present invention is to provide a semiconductor device capable of mixedly mounting a logic chip, an analog chip, a memory chip, etc. by stacking them to each other while stabilizing power supply lines and ground lines of the chips.

To achieve the above object, according to the present invention, there is provided a semiconductor device including: an intermediate substrate having a conductive portion and also having, on its one surface, an external connection terminal conducted to the conductive portion; and semiconductor chips each having connection portions, the semiconductor chips being mounted on both the surfaces of the intermediate substrate; wherein at least two of the semiconductor chips are electrically conducted to each other via the conductive portion of the intermediate substrate; and at least one of a power supply line, a ground line, and a signal line of each of the semiconductor chips is connected to the conductive portion of the intermediate substrate via two or more, conducted to each other, of the connection portions.

With this configuration, since semiconductor chips such as a logic chip, an analog chip, a memory chip, etc. are mounted on both the surfaces of the intermediate substrate, it is possible to realize the mixed mounting of the semiconductor chips, and since at least one of the power supply line, ground line and signal line of each of the semiconductor chips thus mounted is connected to the conductive portion of the intermediate substrate via two or more, conducted to each other, of the connection portions, it is possible to stabilize the power supply lines, ground lines and signal lines of the semiconductor chips.

DETAILED DESCRIPTION OF THE PREFERRED EMBODIMENTS

Hereinafter, an embodiment of a semiconductor device of the present invention will be described in detail with reference to the drawings.

Figure 1:
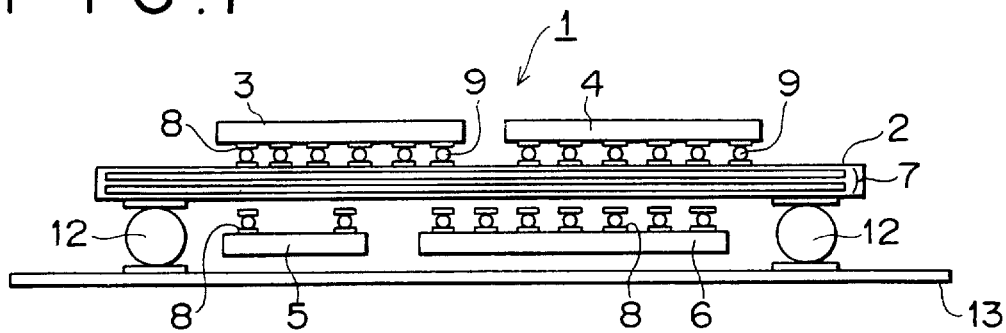
FIG. 1 is a side view showing a schematic configuration of one embodiment of a semiconductor device of the present invention.
Figure 2A:
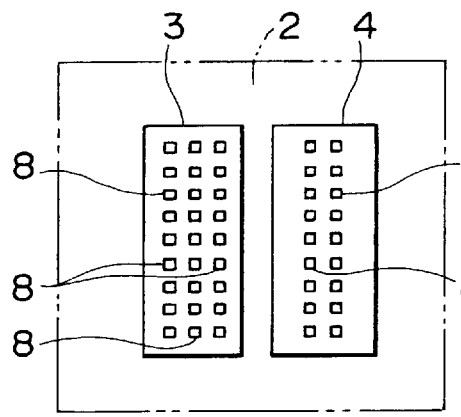
FIGS. 2A and 2B are bottom views each showing a configuration of connection portions of a semiconductor chip.
Figure 2B:
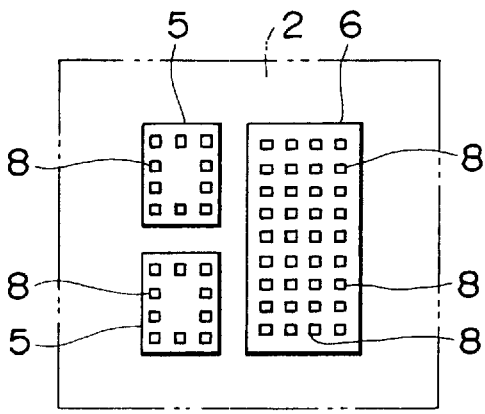

FIG. 1 is a view showing one embodiment of a semiconductor device of the present invention. In this figure, reference numeral 1 designates a semiconductor device. The semiconductor device 1 is a system LSI in which an analog chip 3 and a DRAM chip 4 are mounted on one surface of an intermediate substrate 2 as shown in FIG. 2A, and a high frequency LSI chip 5 and a logic chip 6 having a structure using an SOI substrate are mounted on the other surface of the intermediate substrate 2 as shown in FIG. 2B.

These semiconductor chips 3, 4, 5 and 6 may be each fabricated in accordance with a process optimized for each device category in consideration of its performance, cost, and level of integration. To be more specific, the logic chip 6, which requires high-speed and low power consumption operation at a low voltage, may be fabricated on the basis of a scaling law by using an advanced CMOS logic process allowing high level of integration.

The DRAM chip 4 may be fabricated by using a general purpose DRAM process capable of realizing a large capacity at the least cost.

The analog chip 3, which requires a higher withstand voltage and a higher input range in consideration of the interface relationship with peripheral chips, may be fabricated by a process which is required not to involve an advanced processing technology but to fabricate the chip at a cost lower than that of the logic chip.

The use of the semiconductor chips 3, 4, 5 and 6 fabricated in accordance with the processes optimized as described above, allows realization of a system LSI capable of keeping the performance and cost in balance.

The connection structure of the semiconductor device 1 will be more fully described below. The intermediate substrate 2 has a conductive portion configured as multi-level interconnections 7 made from copper, and each of the semiconductor chips 3, 4, 5 and 6 has connection portions 8. The semiconductor chips 3, 4, 5 and 6 are connected to both the surfaces of the intermediate substrate 2 via the connection portions 8, and further, the electrical connection between these chips, that is, the electrical connection between power supply lines, ground lines and signal lines (not shown) of the chips are performed by the multi-level interconnections 7 of the intermediate substrate 2 via the connection portions 8.

The connection portions 8 of each of the semiconductor chips 3, 4, 5 and 6 are configured by bonding pads which are disposed, on the back surface of the chip, into an array along the vertical and horizontal directions as shown in FIGS. 2A and 2B. In this embodiment, these connection portions 8 are connected to the multi-level interconnections 7 of the intermediate substrate 2 by means of solder ball bumps 9 as shown in FIG. 1.

Figure 3A:
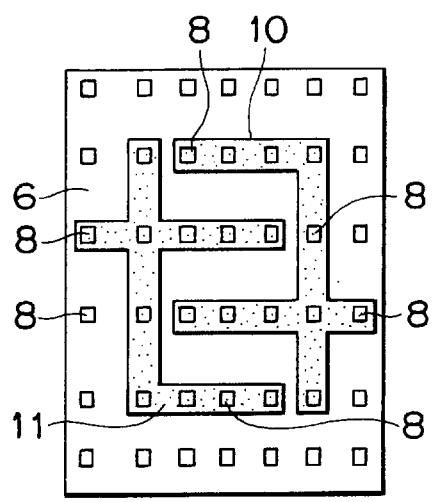
FIG. 3A is a bottom view showing connection portions of a logic chip and a conductive pattern of the connection portions.

The connection portions 8 of each of the semiconductor chips 3, 4, 5 and 6 are separated into groups connected to the power supply line, ground line, and signal line of the chip, and each group of the connection portions 8 are conducted to each other in the chip. In an example of the logic chip 6 shown in FIG. 3A, a number of the connection portions 8 disposed into an array are separated into groups connected to the power supply line, ground line, and signal line. The group of the connection portions 8 connected to the power supply line are conducted to each other by means of a conductive pattern 10 formed in the silicon substrate. The group of the connection portions 8 connected to the ground line are conducted to each other by means of a conductive pattern 11 formed in the silicon substrate. The group of the connection portions 8 connected to the signal line (not shown) are conducted to each other by means of a conductive pattern (not shown) formed in the silicon substrate.

The group of the connection portions 8 formed by the bonding pads, which are conducted to each other by means of the conductive pattern 10 or 11 as described above, are generally called "an area pad", which means that the group of the connection portions 8 form one areal pad as a whole.

Figure 3B:
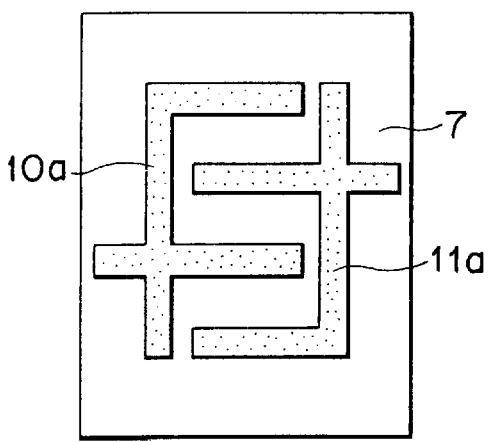
FIG. 3B is a plan view showing the surface of an intermediate substrate.

As shown in FIG. 3B, interconnection patterns 10a and 11a conducted to the multi-level interconnections 7 are formed on the surface of the intermediate substrate 2 in such a manner as to be matched to the conductive patterns 10 and 11 on each of which the group of the connection portions 8 are disposed, respectively. The conductive patterns 10 and 11 are conducted to the corresponding interconnection patterns 10a and 11a via the connection portions 8.

According to this embodiment, since each of the semiconductor chips 3, 4, 5 and 6 is connected to the intermediate substrate 2 by means of the connection portions 8 of the so-called area pad structure, the contact between the chip and the intermediate substrate 2 is not point-contact but nearly area-contact, to reduce the connection resistance therebetween, thereby stabilizing the power supply line, ground line, and signal line of the chip.

In general, the interconnection patterns 10a and 11a of the intermediate substrate 2 and the multi-level interconnections 7 connected thereto are sufficiently lower in resistance than the interconnections in each of the semiconductor chips 3, 4, 5 and 6. Accordingly, since the interconnections of each of the semiconductor chips 3, 4, 5, and 6 are connected to the multi-level interconnections 7 via the interconnection patterns 10a and 11a, a reduction in supply voltage of the chip due to the interconnection resistance increased by a large current applied to the interior of the chip can be significantly improved.

The power supply lines, ground lines, and signal lines of the semiconductor chips 3, 4, 5, and 6 thus electrically connected to the intermediate substrate 2 are collected via the multi-level interconnections 7 to a plurality of external connection terminals 12 provided at a peripheral portion of one surface of the intermediate substrate 2. These external connection terminals 12 are used for mounting the semiconductor device 1 to a printed wiring board 13 while being connected to wiring portions (not shown) of the printed wiring board 13. With this configuration, the power supply lines, ground lines, and signal lines of the semiconductor chips 3, 4, 5, and 6 are connected to the wiring portions of the printed wiring board 13 via the connection portions 8 of the chips, interconnection patterns 10a and 11a of the intermediate substrate 2, multi-level interconnections 7, and the external connection terminals 12, and are connected to wiring portions of electric equipment on which the printed wiring board 13 is mounted.

The configuration of the multi-level interconnections 7 will be described with reference to an example shown in FIG. 4, in which the DRAM chip 4 configured as a general purpose DRAM bare chip is mounted on the upper surface of the intermediate substrate 2, and the logic chip 6 is mounted on the back surface of the intermediate substrate 2. In this example, since the connection portions 8 (interface terminals) of the DRAM chip 4 are partially deviated from the connection portions 8 of the logic chip 6, the interconnections of these chips 4 and 6 must be connected to the interconnections of the intermediate substrate 2 in such a manner as to correct the above positional deviation between both the chips 4 and 6.

Figure 4:
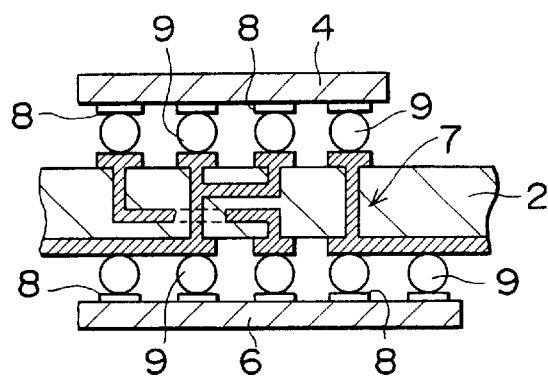
FIG. 4 is a sectional side view of an essential portion of the intermediate substrate illustrating an example of multi-level interconnections of the intermediate substrate.

The multi-level interconnections 7 shown in FIG. 4 can connect the chips to each other via the interconnection patterns (not shown) formed on the surface of the intermediate substrate 2 in such a manner as to enhance the degree of freedom in connection and minimize the connection lengths.

Even in this example, the semiconductor chips 4 and 6 are mounted to the intermediate substrate 2 by connecting solder ball bumps 9 to the connection portions 8 configured as the bonding pads.

According to the semiconductor device 1 having the above configuration, since the semiconductor chips 3, 4, 5, and 6 are mounted on both the surfaces of the intermediate substrate 2, it is possible to mixedly mount different semiconductor chips such as the logic chip 3, DRAM chip 4, high frequency LSI chip 5, and logic chip 6 and hence to reduce the size of the semiconductor device 1 and increase the level of integration of the semiconductor device 1.

Since the power supply line, ground line, and signal line of each of the semiconductor chips 3, 4, 5 and 6 thus mounted are each connected to the multi-level interconnections 7 of the intermediate substrate 2 via a group, conducted to each other, of the connection portions 8, the contact between the chip and the intermediate substrate 2 is not point-contact but nearly area-contact, to reduce the connection resistance therebetween. This makes it possible to significantly reduce a potential drop due to the resistances of the interconnections of the chip, thereby stabilizing the power supply line, ground line, and signal line of the chip.

To be more specific, for a conventional semiconductor chip in which a power supply line or a ground line made from copper having a thickness of 1.5 $\mu$m and a width of 100 $\mu$m is used as an interconnection on the uppermost layer, the resistance per unit interconnection length (10 mm) is 1.3 $\Omega$, and a potential drop caused when a current of 500 mA is applied to the interconnection reaches 0.65 V. Accordingly, it is difficult to design a low power LSI operable at a voltage being as small as 1 V.

On the contrary, in the embodiment of the present invention shown in FIG. 1, the resistance per unit length (10 mm) of the interconnection on the intermediate substrate 2 having a thickness of 50 $\mu$m and a width of 100 $\mu$m is 36 m$\Omega$, and a potential drop when a current of 500 mA is applied to the interconnection is suppressed at 18 mV.

The interconnection layers of the semiconductor chips are connected to the intermediate substrate 2 with a pitch of 300 $\mu$m, the maximum potential drop is about 28 mV (0.65 V×0.3 mm/10 mm/2+18 mV). Accordingly, since the potential drop is very smaller, it is possible to design a low power LSI operable at a voltage being as small as 1 V.

The terminal capacitance upon conventional board mounting is about 10 pF; however, the interconnection capacitance between both chips mounted on the intermediate substrate 2 becomes one-fifth the terminal capacitance, more concretely, about 2 pF per unit interconnection distance (10 mm).

The reduction in power has been achieved by mixedly mounting a DRAM; however, according to the present invention, it is possible to achieve the reduction in power comparable to that obtained in the case of mixedly mounting the DRAM by connecting a specialized logic chip 6 to a specialized DRAM chip 4 with the above low interconnection capacitance.

Since the power supply line, ground line, and signal line are each stabilized, a chip having the structure using an SOI substrate, which is mounted as the logic chip 6, can be operated at a voltage being very lower than 1 V. Further, since the capacitance of a BUS equivalent to mixed mounting of a DRAM chip can be reduced, there can be obtained a device structure expected to minimize the power consumption.

Figure 5:
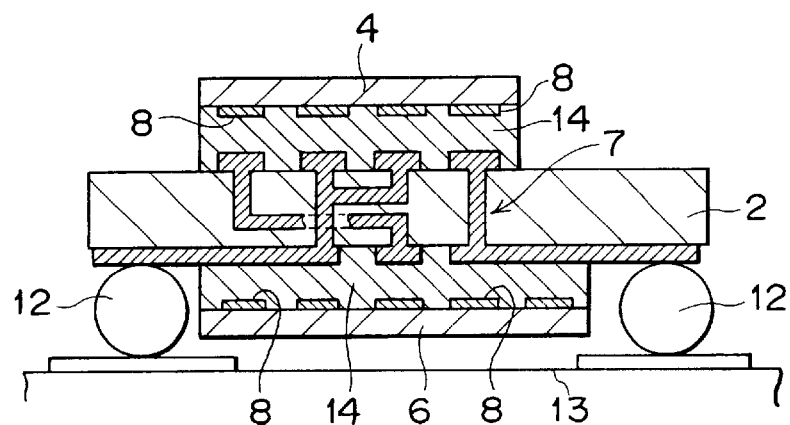
FIG. 5 is a sectional side view showing a schematic configuration of another embodiment of the semiconductor device of the present invention.

While the connection portions 8 of the semiconductor chips 3, 4, 5 and 6 are connected to the intermediate substrate 2 by means of the solder ball bumps 9 in the above embodiment, the present invention is not limited thereto. For example, the connection portions 8 may be connected to the intermediate substrate 2 by means of an anisotropic conductive film (ACF) 14 as shown in FIG. 5. The anisotropic conductive film 14 allows electric connection between the connection portions 8 and the intermediate substrate 2 by applying heat and pressure thereto. The use of the anisotropic conductive film 14 allows a region in which the connection portions 8, that is, the bonding pads are present to be made electrically conductive in the vertical direction, and also allows adjacent two of the connection portions 8 to be significantly simply separated from each other.

The conductive portion of the intermediate substrate 2 is not limited to the multi-level interconnections 7 but may be a single layer interconnection.

Figure 6:
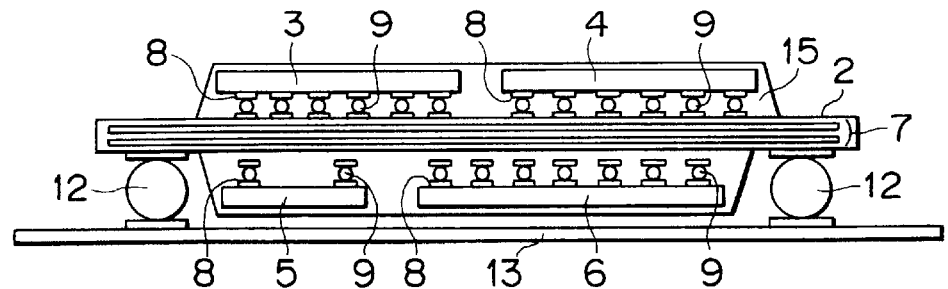
FIG. 6 is a side view showing a schematic configuration of one variation of the embodiment of the semiconductor device of the present invention shown in FIG. 1.
Figure 7:
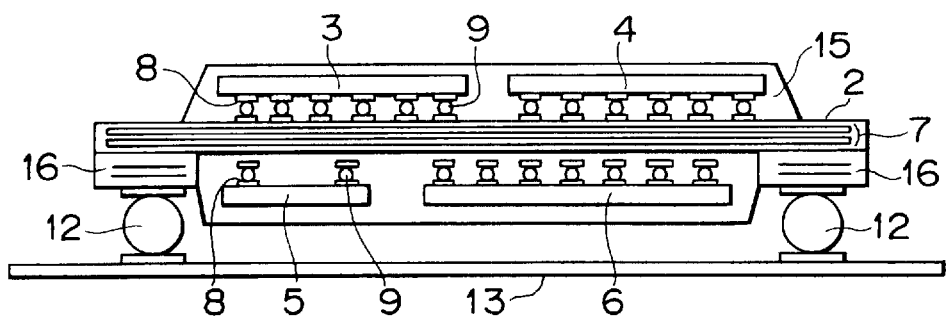
FIG. 7 is a side view showing a schematic configuration of another variation of the embodiment of the semiconductor device of the present invention shown in FIG. 1.
Figure 8:
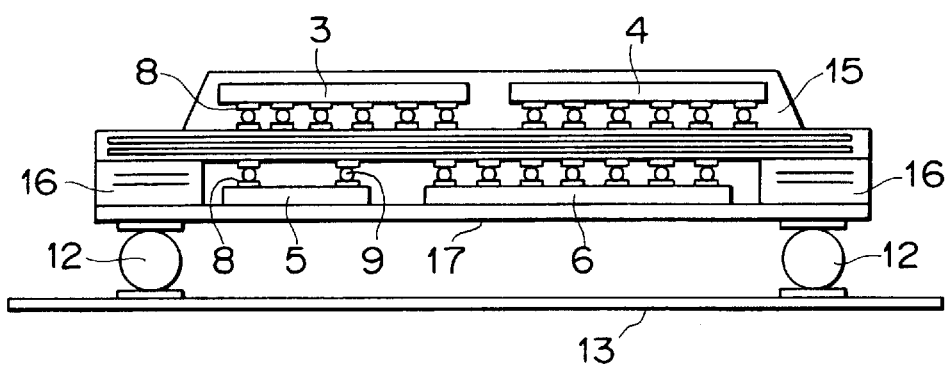
FIG. 8 is a side view showing a schematic configuration of a further variation of the embodiment of the semiconductor device of the present invention shown in FIG. 1.

FIGS. 6 to 8 show variations of the semiconductor device shown in FIG. 1. In the variation shown in FIG. 6, semiconductor chips 3, 4, 5, and 6 are mounted, on the flip-chip basis, on an intermediate substrate 2 and are sealed with a resin 15, to form a semiconductor device, and the semiconductor device is mounted, on the flip-chip basis, on a printed wiring board 13 positioned outside the intermediate substrate 2 by means of external connection terminals 12 provided at a peripheral portion on one surface of the intermediate substrate 2. With this structure, since the semiconductor chips 3, 4, 5, and 6 are mounted, on the flip-chip basis, on the intermediate substrate 2 and the semiconductor device thus obtained is directly mounted, on the flip-chip basis, on the printed wiring board 13, it is possible to suppress the overall height of the semiconductor device, and hence to realize high density mounting of the semiconductor device.

The variation shown in FIG. 7 is different from that shown in FIG. 6 in that an additional substrate 16 is provided between the intermediate substrate 2 and each external connection terminal 12 for enhancing the degree of freedom in connection to an external pin. With this configuration, it is possible to increase the mechanical strength of a PKG (package), and to reduce the number of interconnection layers of the intermediate substrate 2.

The variation shown in FIG. 8 is different from that shown in FIG. 7 in that a reinforcement substrate 17 is provided between the additional substrate 16 and the external connection terminal 12 in such a manner as to cover the entire bottom surface of the intermediate substrate 2 for fixedly supporting a high frequency LSI chip 5 and a logic chip 6. With this configuration, it is possible to further enhance the mechanical strength and the reliability.

As described above, according to the semiconductor device of the present invention, since semiconductor chips are mounted on both the surfaces of the intermediate substrate, it is possible to mixedly mount different semiconductor chips such as a logic chip, an analog chip, and a memory chip and hence to reduce the size of the semiconductor device and increase the level of integration of the semiconductor device.

Since at least one of the power supply line, ground line, and signal line of each of the semiconductor chips thus mounted is connected to the conductive portion of the intermediate substrate via two or more, conducted to each other, of the connection portions, the contact between the chip and the intermediate substrate is not point-contact but nearly area-contact, to reduce the connection resistance therebetween, thereby significantly reducing a potential drop due to the resistances of the interconnections of the chip. This makes it possible to stabilize the power supply line, ground line, and signal line of the chip and hence to improve the electric characteristics of the chip.

In particular, the realization of an LSI of a device operable at an ultra-low voltage such as a device using an SOI substrate is obstructed by the fact that the mixed mounting of a DRAM is very difficult in terms of its process technology and the fact that the operation of the device at an ultra-low voltage being significantly lower than 1 V cannot be ensured due to a potential drop caused by the large-scale integration; however, according to the present invention, the mixed mounting of a DRAM and the operation of the device at a ultra-low voltage can be simultaneously realized, and therefore, the present invention allows the device operable at an ultra-low voltage to be applied to the LSI system.

While the preferred embodiment of the present invention has been described using the specific terms, such description is for illustrative purposes only, and it is to be understood that changes and variations may be made without departing from the spirit or scope of the following claims.

What is claimed is:

1. A semiconductor device comprising:
   an intermediate substrate having multi-level interconnections disposed between a first surface and a second surface; and
   a plurality of semiconductor chips, wherein a first semiconductor chip comprises at least two power supply pins, at least two ground pins, and at least two signal pins and a second semiconductor chip comprises at least two power supply pins, at least two ground pins, and at least two signal pins,
   wherein one of the at least two power supply pins, at least two ground pins, and at least two signal pins of the first semiconductor chip are electrically connected to the power supply pins, the ground pins, and the signal pins of the second semiconductor chip, respectively, through the multi-level interconnections.

2. A semiconductor device according to claim 1, wherein the pins of each of the semiconductor chips are connected to the multi-level interconnections of the intermediate substrate by solder ball bumps.

3. A semiconductor device according to claim 1, wherein the pins of each of the semiconductor chips are connected to the multi-level interconnections of the intermediate substrate by an anisotropic conductive film.

4. A semiconductor device according to claim 1, wherein at least one of the semiconductor chips is a chip having a structure using a silicon on insulator (SOI) substrate.

5. A semiconductor device comprising:
   a substrate that defines a plurality of level, wherein the substrate comprises a first interconnection pattern on a lower surface at a first level, a second interconnection pattern at a second level that is above the first level, a third interconnection pattern at a third level that is above the second level, and a fourth interconnection pattern on an upper surface at a fourth level that is above the third level,
   wherein the first, second, and fourth interconnection patterns are electrically connected together as one of a power supply area, a ground area, and a signal area,
   wherein the first, third, and fourth interconnection patterns are electrically connected together as a different one of a power supply line, a ground line, and a signal line, and
   wherein the second and third interconnection patterns define multi-level interconnections;
   a plurality of semiconductor chips, wherein one of power supply pins, ground pins, and signal pins of a first semiconductor chip respectively is coupled to the power supply area, the ground area, and the signal area from the lower surface of the substrate, and
   wherein one of power supply pins, ground pins, and signal pins of a second semiconductor chip respectively is coupled to the power supply area, the ground area, and the signal area from the upper surface of the substrate.

6. A semiconductor device according to claim 5, wherein the pins of each of the semiconductor chips are connected to the multi-level interconnections of the substrate by solder ball bumps.

7. A semiconductor device according to claim 5, wherein the pins of each of the semiconductor chips are connected to the multi-level interconnections of the substrate by an anisotropic conductive film.

8. A semiconductor device according to claim 5, wherein at least one of the semiconductor chips is a chip having a structure using a silicon on insulator (SOI) substrate.

* * * * *